(12) United States Patent
Liu et al.

(10) Patent No.: US 6,960,739 B2
(45) Date of Patent: *Nov. 1, 2005

(54) SCRIBING SAPPHIRE SUBSTRATES WITH A SOLID STATE UV LASER

(75) Inventors: Kuo-Ching Liu, Fremont, CA (US); Pei Hsien Fang, Los Altos Hills, CA (US); Dan Dere, Palo Alto, CA (US); Jenn Liu, Fremont, CA (US); Jih-Chuang Huang, Santa Clara, CA (US); Antonio Lucero, Fresno, CA (US); Scott Pinkham, Bozeman, MT (US); Steven Oltrogge, Belgrade, MT (US); Duane Middlebusher, San Jose, CA (US)

(73) Assignee: New Wave Research, Fremont, CA (US)

( * ) Notice: Subject to any disclaimer, the term of this patent is extended or adjusted under 35 U.S.C. 154(b) by 41 days.

This patent is subject to a terminal disclaimer.

(21) Appl. No.: 10/384,439

(22) Filed: Mar. 6, 2003

(65) Prior Publication Data

US 2003/0226832 A1 Dec. 11, 2003

Related U.S. Application Data

(63) Continuation of application No. 10/208,484, filed on Jul. 30, 2002, now Pat. No. 6,580,054.
(60) Provisional application No. 60/387,381, filed on Jun. 10, 2002.

(51) Int. Cl.[7] ............................................. B23K 26/38
(52) U.S. Cl. ............................................. 219/121.69
(58) Field of Search .............. 219/121.68, 121.67, 219/121.69, 121.7, 121.71, 121.72, 121.83, 121.82; 264/400; 156/272.8

(56) References Cited

U.S. PATENT DOCUMENTS 3,626,141 A  12/1971  Daly
3,814,895 A   6/1974  Fredriksen (Continued)

FOREIGN PATENT DOCUMENTS

EP    1137072     9/2001
JP    55151351    11/1980

(Continued)

OTHER PUBLICATIONS

Spectra–Physics Business Units: Products http://www.splasers.com/products/oem_products/fcb_yhp_series.html (Oct. 7, 2002), 2 pages.

(Continued)

Primary Examiner—Jonathan Johnson
(74) Attorney, Agent, or Firm—Haynes Beffel & Wolfeld LLP (57) ABSTRACT

A process and system scribe sapphire substrates, by performing the steps of mounting a sapphire substrate, carrying an array of integrated device die, on a stage such as a movable X-Y stage including a vacuum chuck; and directing UV pulses of laser energy directed at a surface of the sapphire substrate using a solid-state laser. The pulses of laser energy have a wavelength below about 560 nanometers, and preferably between about 150 in 560 nanometers. In addition, energy density, spot size, and pulse duration are established at levels sufficient to induce ablation of sapphire. Control of the system, such as by moving the stage with a stationary beam path for the pulses, causes the pulses to contact the sapphire substrate in a scribe pattern at a rate of motion causing overlap of successive pulses sufficient to cut scribe lines in the sapphire substrate.

6 Claims, 10 Drawing Sheets

U.S. PATENT DOCUMENTS

| | | | |
|---|---|---|---|
| 3,816,700 A | 6/1974 | Weiner et al. | |
| 4,237,601 A | 12/1980 | Woolhouse et al. | |
| 4,336,439 A | 6/1982 | Sasnett et al. | |
| 4,543,464 A | 9/1985 | Takeuchi | |
| 4,562,333 A | 12/1985 | Taub et al. | |
| 4,664,739 A | 5/1987 | Aurichio | |
| 4,769,523 A | 9/1988 | Tanimoto et al. | |
| 4,906,011 A | 3/1990 | Hiyamizu et al. | |
| 4,921,564 A | 5/1990 | Moore | |
| 5,057,664 A | 10/1991 | Johnson et al. | |
| RE33,947 E | 6/1992 | Shinohara | |
| 5,138,131 A | 8/1992 | Nishikawa et al. | |
| 5,324,012 A | 6/1994 | Aoyama et al. | |
| 5,387,776 A | 2/1995 | Preiser | |
| 5,611,946 A | 3/1997 | Leong et al. | |
| 5,626,777 A | 5/1997 | Hugl et al. | |
| 5,627,109 A | 5/1997 | Sassa et al. | |
| 5,656,186 A * | 8/1997 | Mourou et al. | 219/121.69 |
| 5,703,713 A | 12/1997 | Leong et al. | |
| 5,801,356 A | 9/1998 | Richman | |
| 5,809,987 A | 9/1998 | Wark et al. | |
| 5,811,751 A | 9/1998 | Leong et al. | |
| 5,961,852 A | 10/1999 | Rafla-Yuan et al. | |
| 5,963,364 A | 10/1999 | Leong et al. | |
| 5,987,920 A | 11/1999 | Bosman et al. | |
| 5,994,205 A | 11/1999 | Yamamoto et al. | |
| 6,057,525 A | 5/2000 | Chang et al. | |
| 6,107,162 A | 8/2000 | Morita et al. | |
| 6,121,118 A | 9/2000 | Jin et al. | |
| 6,126,520 A | 10/2000 | Jochim-Schmidt et al. | |
| 6,130,401 A * | 10/2000 | Yoo et al. | 219/121.6 |
| 6,182,733 B1 | 2/2001 | McReynolds | |
| 6,365,429 B1 | 4/2002 | Kneissl et al. | |
| 6,413,839 B1 | 7/2002 | Brown et al. | |
| 6,509,546 B1 * | 1/2003 | Egitto et al. | 219/121.68 |
| 6,586,707 B2 | 7/2003 | Boyle et al. | |
| 6,664,498 B2 | 12/2003 | Forsman et al. | |
| 6,676,878 B2 | 1/2004 | O'Brien et al. | |
| 2002/0031899 A1 | 3/2002 | Manor | |
| 2002/0033558 A1 | 3/2002 | Fahey et al. | |
| 2002/0063361 A1 | 5/2002 | Fahey | |
| 2002/0125232 A1 | 9/2002 | Choo et al. | |
| 2003/0209528 A1 | 11/2003 | Choo et al. | |

FOREIGN PATENT DOCUMENTS

| | | |
|---|---|---|
| JP | 56006451 | 1/1981 |
| JP | 5706650 | 4/1982 |
| JP | 57081985 | 5/1982 |
| JP | 58044738 | 3/1983 |
| JP | 58044739 | 3/1983 |
| JP | 58068946 | 4/1983 |
| JP | 5-325996 | 12/1993 |
| JP | 9-345937 | 12/1997 |
| JP | 10064854 | 3/1998 |
| JP | 10-190117 | 7/1998 |
| JP | 11-163403 | 6/1999 |
| JP | 11-177137 | 7/1999 |
| JP | 11224866 | 8/1999 |
| JP | 11-267867 | 10/1999 |
| JP | 2000004066 | 1/2000 |
| JP | 2000-61677 | 2/2000 |
| JP | 2000-156358 | 6/2000 |
| JP | 2000196186 | 7/2000 |
| JP | 2001-170786 | 6/2001 |
| JP | 3449201 | 7/2003 |
| WO | WO 00/75983 | 12/2000 |

OTHER PUBLICATIONS

Spectra–Physics: Products http:www.splasers.com/products/oem_products/navigator1.html (Oct. 7, 2002), 2 pages.

Furukawa Electric, "What is UV–tapes?" http://www.furukawa.co.jp/uvtape/en/whatis.htm (May 23, 2002) 2 pages.

Furukawa Electric product brochure, "UV–tapes for Semiconductor Processing" 8 pages, no date avail.

Won, Willam, "Integration of GaN Thin Films with Dissimilar Substrate Materials by Wafer Bonding and Laser Lift–Off," Ph.D. Dissertation, U.C. Berkeley, Fall 1999, 135 pages.

Jersch, J., et al., "Nanostructuring with laser radiation in the near field of a tip from a scanning force microscope," Appl. Phys. A 64, 29–32 (1997).

Lee, J.–M., et al., "Scribing and cutting a blue LED wafer using a Q–switched Nd: YAG laser," Appl. Phys. A 70, 561–564 (2000).

Chen, Hung–Lung, et al., "Laser Successfully Cuts Sapphire Substrate," Optical Communication 93, 37–40, Dec. 2001 (English translation and the original Chinese included herein).

Veiko, V.L., et al., "Laser Technology and Micro Electronics," Publishing House of the Bulgarian Academy of Sciences, 1991. 12 pages. (Included herein is Chinese translation of the original Russian and English translation of the Chinese translation.).

* cited by examiner

FIG. 13 groove →

FIG. 14 groove →

SCRIBING SAPPHIRE SUBSTRATES WITH A SOLID STATE UV LASER

RELATED APPLICATION DATA

This application is a continuation of application Ser. No. 10/208,484 entitled Scribing Sapphire Substrates with a Solid State UV Laser filed 30 Jul. 2002 (now U.S. Pat. No. 6,580,054), which application claims the benefit of Provisional Application No. 60/387,381 entitled Scribing Sapphire Substrates With a Solid State UV Laser, filed 10 Jun. 2002. This application is related to application Ser. No. 10/364,587 filed 11 Feb. 2003 entitled Scribing Sapphire Substrates With a Solid State UV Laser.

BACKGROUND OF THE INVENTION

1. Field of the Invention

The present invention relates to systems and processes used in manufacturing integrated device die, such as integrated circuit and laser die, including diode laser die, formed on sapphire substrates. More particularly, the present invention provides for scribing sapphire substrates using solid state UV lasers, and separating the scribed sapphire substrate into die.

2. Description of Related Art

Sapphire $Al_2O_3$ is used as a substrate for a variety of devices. The sapphire is a hard material that is optically transmissive, electrically nonconducting and a good conductor of heat. It has become the preferred substrate material in manufacturing of laser diodes. In particular, blue laser diodes and other structures based on gallium nitride GaN and related materials are manufactured on sapphire substrates in large volume.

One bottleneck in manufacturing of die on sapphire substrates is the separation of the die from the substrate. Because sapphire is very hard, the typical process requires the use of a diamond tipped blade to scribe a pattern in the substrate. In one common method, the sapphire substrate having an array of semiconductor structures such as laser diodes formed thereon is placed on an adhesive known as "blue tape," or "wafer tape." A diamond blade is used to scribe the substrate. Mechanical stress is used to crack the substrate along scribe lines. The tape carrying the cracked substrate is then stretched to separate the die. A robotic pick and place machine is used to remove the individual die, having typical dimensions in a range of 200 to 500 microns on a side, from the tape.

One major bottleneck in the manufacturing of the die is the cutting process. The diamond blade requires the manufacturer to allocate a relatively wide scribe line, referred to as a "street," (for example, 40 to 70 microns) on the substrate, reducing the number of die manufacturable on a single substrate. In addition, the diamond tip blade must be operated relatively slowly, requiring as much as 1 and a half hours for a 2 inch diameter substrate. Also, the diamond tips on the blade wear out and must be replaced often, as much as one blade per wafer. Replacement of the blades slows down the process of manufacturing. Also, the blades typically have multiple tips, which must be carefully and precisely aligned for proper cutting each time a new tip is brought on line, and each time a new blade is installed. Finally, the mechanical scribing process causes cracks, which can damage the die and reduce yields. Typical yields for this process have been reported to be about 70%.

It is desirable, therefore, to provide a system and method for scribing sapphire substrates in manufacturing die which is faster, easier to use, minimizes the number of consumable parts, allows for greater density and achieves greater yields than is available using current technologies. Further, it is desirable that such system be compact, safe to operate and low-cost.

SUMMARY OF THE INVENTION

The present invention provides a method and system for manufacturing integrated device die, such as diode laser die, from a sapphire substrate carrying an array of such integrated devices. Particularly, the present invention is suitable for manufacturing blue laser diodes based on gallium nitride structures. According to the present invention, greater density and greater yield are achieved, while also reducing the time required to separate the individual die from the substrate. Furthermore, the present invention is based on compact, low-cost machines, and otherwise reduces the overall manufacturing costs for such integrated device die.

The present invention provides a process including mounting a sapphire substrate, carrying an array of integrated devices, on a stage such as a movable X-Y stage including a vacuum chuck. Next, pulses of laser energy are directed at a surface of the sapphire substrate using a solid-state laser. The pulses of laser energy have a wavelength below about 560 nanometers, and preferably between about 150 and 560 nanometers. In addition, energy density, spot size, and pulse duration are established at levels sufficient to induce ablation of sapphire. Control of the system, such as by moving the stage with a stationary beam path for the pulses, causes the pulses to contact the sapphire substrate in a scribe pattern at a rate of motion causing overlap of successive pulses sufficient to cut scribe lines in the sapphire substrate.

Embodiments of the present invention produce laser pulses having an energy density between about 10 and 100 joules per square centimeter, a pulse duration between about 10 and 30 nanoseconds, and a spot size between about 5 and 25 microns. The repetition rate for the pulses is greater than 5 kHz, and preferably ranges from about 10 kHz to 50 kHz or higher. The stage is moved at a rate of motion causing overlap of the pulses in the amount of 50 to 99 percent. By controlling the pulse rate, the rate of motion of the stage, and the energy density, the depth of the scribe line can be precisely controlled. In embodiments of the invention, the scribe lines are cut to a depth of about one-half the thickness, or more, of the sapphire substrate, so that for an 80 micron thick substrate, the scribe line is cut to a depth in the range of about 35 microns to, for example, 60 microns, and more preferably greater than 40 microns.

In embodiments of the present invention, the solid-state laser comprises a diode pumped, Q-switched, $Nd:YVO_4$ laser, including harmonic frequency generators such as nonlinear crystals like LBO, so that output of the laser is provided at one of the second, third, fourth and fifth harmonic frequencies of the 1064 nanometer line produced by the neodymium doped, solid-state laser. In particular systems, the third harmonic frequency of about 355 nanometers is provided. In other embodiments, the solid-state laser comprises a Q-switched, Nd:YAG laser, operating to provide one of the harmonic frequencies as output.

In embodiments of the invention, the method includes detecting edges of the sapphire substrate while directing pulses at the substrate in the scribe pattern. In response to detected edges, the system prevents the pulses of radiation from being directed off of the substrate.

Embodiments of the present invention direct the pulses of radiation at the backside of the substrate. This prevents damage potentially caused by heat from reaching the active integrated device die structures. Furthermore, it prevents debris from the ablation process from contaminating the integrated devices on the die.

Thus, embodiments of the invention include placing the top surface of the substrate on an adhesive tape prior to scribing, mounting the substrate with the adhesive tape on the stage, moving the substrate under conditions causing ablation of the sapphire in a scribe pattern on the backside of the substrate, and detecting edges of the substrate during the scribing process to prevent the pulses of radiation from impacting the adhesive tape.

The die defined by a scribe pattern are separated from the sapphire substrate, by mechanically cracking the substrate along the scribe lines, and using a pick and place robot or other technology known in the art. In one embodiment, the sapphire substrate is placed on an adhesive tape prior to scribing, and after scribing the substrate is rolled or otherwise mechanically manipulated to break the substrate along scribe lines in the scribe pattern. The separated die remain adhered to the adhesive tape, until separated using the pick and place robot, or other technology.

Embodiments of the invention further provide for controlling polarization of the laser pulses with respect to direction of scribe lines in the scribe pattern. The polarization is controlled so that the grooves are more uniform for scribe lines parallel to different axes. Uniformity can be improved by random or circular polarization of the pulses in some embodiments. More preferably, polarization of the pulse is controlled so that the polarization is linear and parallel to the scribe line being cut. It is found that the quality of the groove being formed is more V-shaped with parallel polarization, and more U-shaped with polarization that is not aligned. V-shaped grooves are preferred for more uniform and predictable breaking of the substrate during separation of the die. Embodiments of the invention provide for control of the polarization using a laser with an adjustable polarizer, such as a half wave plate, in the optical path.

The invention also provides a system for scribing sapphire which comprises a solid-state laser, as described above, a stage adapted to support and move a sapphire substrate, optics directing pulses to impact of sapphire substrate mounted on the stage, an edge detection system which detects edges of substrate mounted on the stage during movement of the stage, and a control system. The control system in embodiments of the invention comprises a computer system coupled to the solid-state laser, the stage, and the edge detection system. The computer is responsive to the edge detection system and parameters set by users to cause the pulses to impact of the sapphire substrate in a scribe pattern at a rate of motion causing overlap of successive pulses sufficient to cut scribe lines in the sapphire substrate. Embodiments of the invention also include a debris exhaust system coupled with the stage.

Embodiments of the invention include a user interface with logic to set up the scribe pattern, and the operational parameters including pulse repetition rate, stage velocity and energy levels to establish scribe depth, scribe speed and other characteristics of the process.

Other aspects and advantages of the present invention can be seen on review of the drawings, the detailed description and the claims, which follow.

DETAILED DESCRIPTION

A detailed description of embodiments of the present invention is provided with reference to FIGS. 1 through 8A–8C, and experimental results are shown in FIGS. 9–16.

Figure 1:
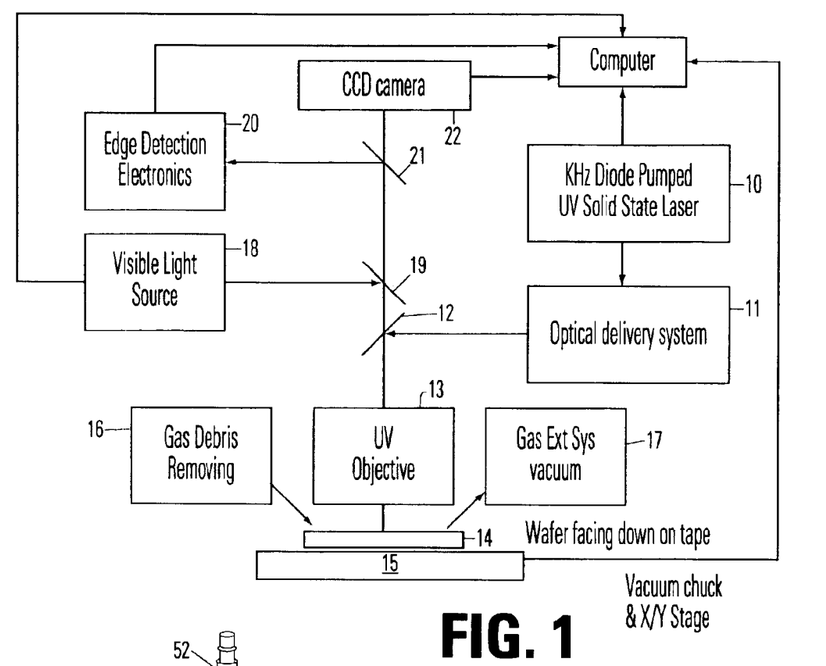
FIG. 1 is a simplified block diagram of a sapphire scribing system according to the present invention.

FIG. 1 is a simplified block diagram of a sapphire scribing system according to the present invention. In the embodiment shown, a diode pumped, solid-state laser 10 generates high-density UV and close-to-UV pulses at a repetition rate in the kHz range. In preferred systems, the laser comprises a Q-switched Nd:YVO$_4$ medium delivering third harmonic output as the stream of laser pulses at a repetition rate greater than 10 kHz, with a pulse duration of about 40 nanoseconds. The pulses are provided using an optical delivery system 11 and turning mirror 12 to an ultraviolet objective lens 13, which focuses the pulses on a sapphire substrate 14. The substrate 14 is supported on a vacuum chuck and X/Y stage 15. Preferably, the wafer is supported face down on an adhesive wafer tape. A gas debris removing system 16 cooperates with a gas exhaust system and vacuum 17 to remove debris generated by the ablation of the sapphire substrate.

A visible light source 18 and a turning mirror 19 deliver white light through the objective lens 13 to the sapphire substrate 14. The edge detection electronics 20 is responsive to light reflected via the objective lens 13 and turning mirror 21 to detect edges of the substrate and prevent pulses of UV radiation from being directed off of the substrate onto the backing wafer tape or elsewhere. A camera 22 such as a charge coupled device camera is focused on the wafer 14 and used to generate an image for information processing and monitoring. Computer 23 is coupled to the controllable components of the system, and causes the delivery of the pulses, movement of the stage 15 and controls other characteristics of the system to scribe the substrate in a scribe pattern.

Figure 2:
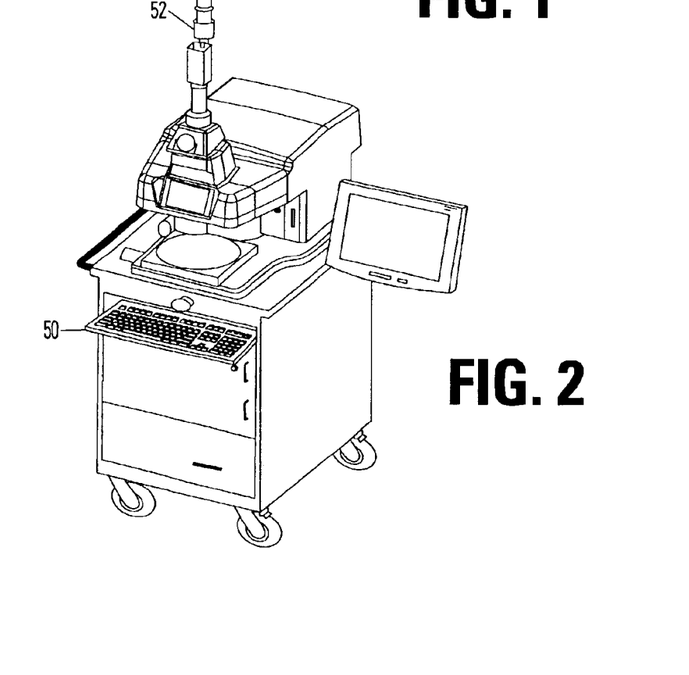
FIG. 2 is a perspective view of a compact, portable sapphire scribing system according to one embodiment of the present invention.

FIG. 2 is a perspective view of a sapphire substrate scribing system in one embodiment of the invention. The diode pumped solid-state laser is compact and low-cost so that it is efficiently mounted on a cart as illustrated. The computer and other system electronics are contained on the cart. The computer keyboard 50 is mounted on a keyboard tray, which slides in and out of the cart. A flat-panel display 51 is mounted on a swivel base, so that it may be folded in during movement and storage of the cart. The system includes a microscope 52, which enables viewing of the wafer during the cutting process. Images generated by the camera 22, and graphical user interface tools and other display constructs are presented to the user using the display 51.

Generally, embodiments of the present invention are provided as a semi-automatic turnkey system using a table-top laser system and computer mounted on a cart. The system provides for manual loading and unloading of wafers. However, the invention contemplates automated wafer loading and unloading systems as well. Representative systems are adapted to receive two inch sapphire wafers with die sizes, for example in the range of 250 microns by 250 microns. Smaller and larger die sizes are readily handled. The wafer thickness ranges from about 80 to 200 microns, for typical laser diode die, and is mounted face down on a 6.5 inch wafer metal frame using adhesive wafer tape. The wafer metal frame is manually placed on the stage and secured using a vacuum chuck. Manual alignment of the wafer is possible using manual stage controls. Software controlled scribe patterns are implemented with computer control of the wafer stage, and controllable speed in the X- and Y-directions. The system includes a class one laser system which generate spot sizes less than 20 microns in operational conditions. A groove is cut, preferably about 40 microns deep, and more preferably greater than about ½ thickness of the sapphire substrate. Nitrogen gas is used by the debris removing jet, and evacuated using an exhaust pump. Throughput of the representative system is about ½ hour per wafer, or greater. No damage is caused to the wafer tape because of the edge detection process, supporting greater yield in the die separation process.

The X/Y stage in one preferred system has a maximum speed of 100 mm per second, and a travel range of greater than 100 mm by 75 mm. The resolution of the stage alignment process is about one micron. The accuracy over four inches of travel range is less than 4 microns. Repeatability of scribe lines provides for deviation of less than three microns. The flatness of the stage is less than 1.5 microns deviation per inch. No rotation is required in some embodiments. The vacuum chuck is at least 2.5 inches in diameter, on a six inch platform, for holding a two inch wafer during alignment and scribing.

The laser system in a preferred embodiment is a Q-switched, diode pumped, third harmonic Nd:YVO$_4$ providing an output at 355 nanometers wavelength. The laser provides one watt output power at 20 kHz, and higher, electro-optically Q-switched output using first pulse suppression. The pulses have a TEM$_{00}$ intensity profile with 10 to 15 micron, or smaller, diameter at 1/e$^2$ peak magnitude spot size on the target surface. The laser pulse duration is about 40 nanoseconds, or less and more preferably between about 30 and 10 nanoseconds, for example about 16 nanoseconds. It is linearly polarized with external rotation control of a half wave plate up to 45 degrees for alignment with the crystalline structure of the sapphire for good and uniform coupling of energy into the sapphire.

The computer system allows for automated control of the laser and stage movement for defined cutting patterns, which can be set up using the computer. A wafer map and cutting definition function allows setup of the scribe pattern including rotation control of the stage. Video overlay shows live video of the sample within a software-controlled window to facilitate set up and monitoring of the process. Control for the cutting parameters including laser energy, repetition rate and stage speed are provided via the user interface, giving the operator precise control over the depth and quality of the scribing process. A pattern alignment function allows the cutting pattern to be moved in the X-, Y- and orthogonal directions to match the actual wafer location during setup.

Figure 3:
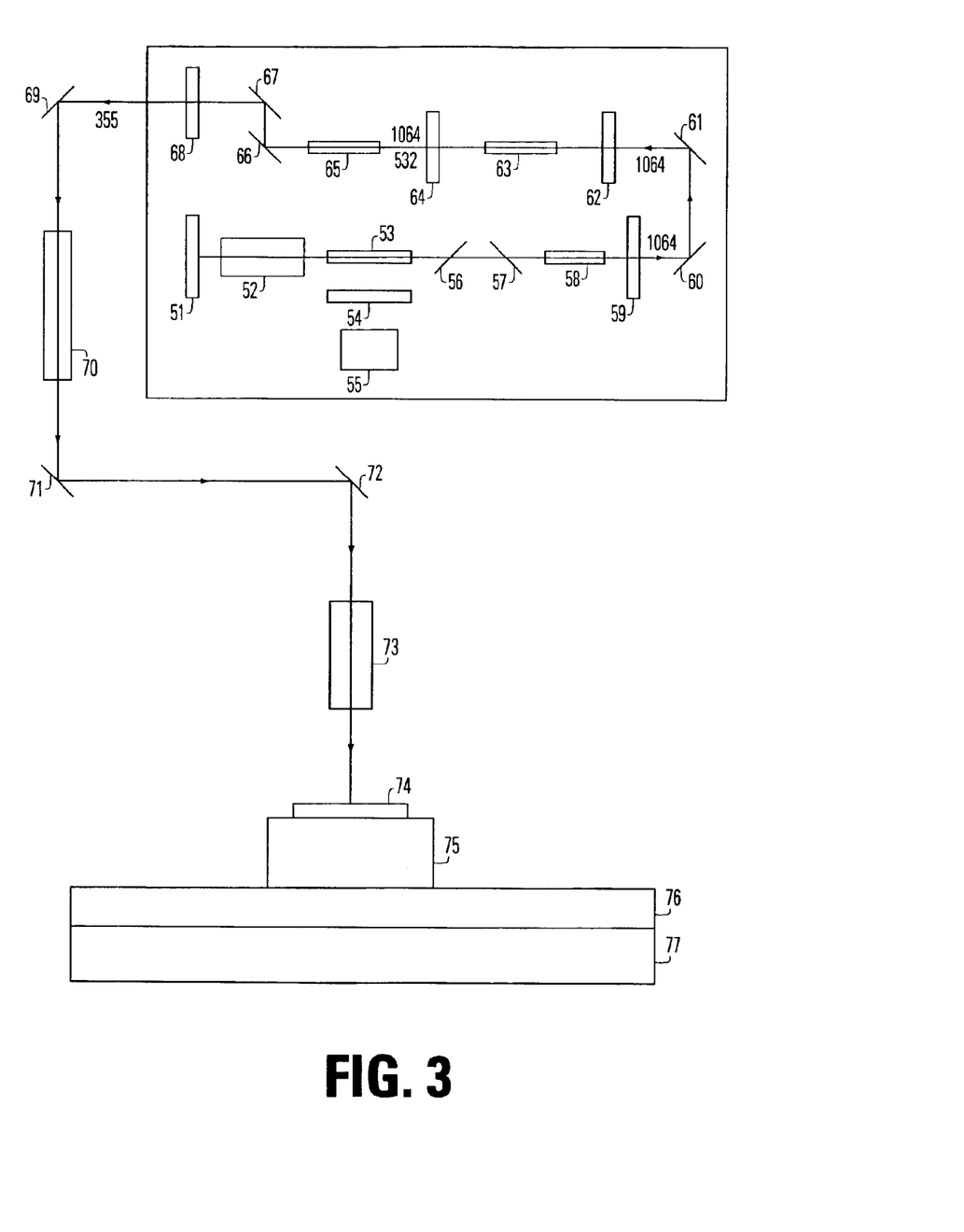
FIG. 3 is a simplified block diagram including the laser system and optics for the sapphire scribing system of the present invention.

FIG. 3 is a basic layout of optical path for one embodiment of the scribing system according to the present invention. The optical path includes a laser 50, optics delivering the output of the laser to a substrate 74 on the vacuum chuck 75 mounted on an X-stage 76 and Y-stage 77. The laser includes a resonant cavity defined by high reflector 51 and output coupler 59. A beam expander 52, laser medium rod 53, cylindrical lens 54, diode array 55, thin film polarizer 56, thin film polarizer 57, and electro-optic Q-switch 58 are included. The diode array is operated to pump the rod 53 to induce resonance at the 1064 nm line for Nd:YVO$_4$. The output beam is directed to turning mirror 60 and turning mirror 61 through spherical focal lens 62 through nonlinear crystal 63. The nonlinear crystal 63 produces a second harmonic and passes the second harmonic along with the primary line through spherical focal lens 64 to a second nonlinear crystal 65. The second nonlinear crystal produces a third harmonic output, among others, which is delivered to turning mirror/filter 66 and turning mirror/filter 67 and half lambda wave plate 68. The wave plate 68 is motorized and acts as a controllable polarizer for the output beam. The wave plate 68 is used to align the polarization of the output beam with respect to the scribing direction to make a grooves cut by the laser pulses uniform in the X- and Y-directions. The third harmonic output, at a wavelength of about 355 nanometers, is delivered to optics including turning mirror 69, beam expander 70, turning mirror 71, turning mirror 72 and objective 73 to the sapphire substrate 74. The objective lens 73 is a 20X lens in this embodiment.

Rod 53 in one preferred system is a Nd:YVO$_4$ solid-state laser medium. This material allows for shorter pulse durations and higher Q-switch repetition rates than other suitable materials, such as Nd:YAG or Nd:YLF. However, other solid-state laser media, including without limitation, Nd:YAG, Nd:YLF, and other media suitable for generation of ultraviolet and close-to-ultraviolet pulses at high repetition rates, are utilized in some embodiments. Preferred output wavelengths for the solid-state Nd—based media includes the second, third, fourth and fifth harmonics of the infrared 1064 nm line, within a range of about 560 nanometers to about 150 nm. Higher wavelengths into the visible range may not be as efficient for ablation of sapphire, while wavelengths below 150 nm require an evacuated optical path for efficient operation.

Figure 4:
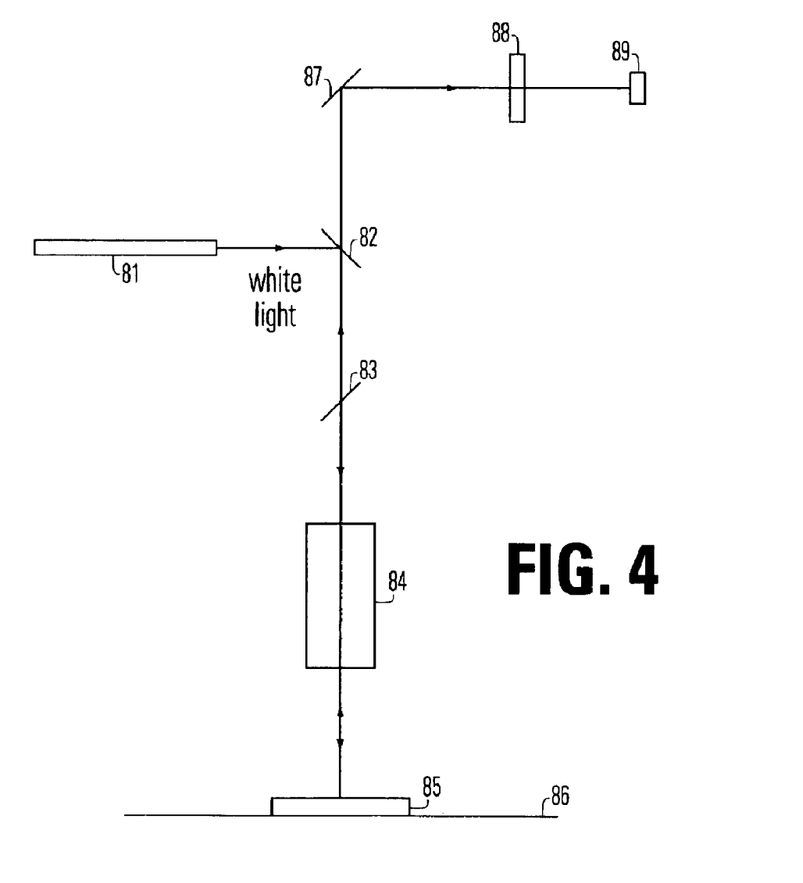
FIG. 4 is a simplified diagram of components of the edge detection system according to the present invention.

FIG. 4 illustrates the edge detection system used in preferred embodiments of the present invention. The system includes a white light source 81 which provides light through turning mirror 82 and objective lens 84 to the sapphire substrate 85 on wafer tape 86, or other mounting media. Reflected light passes through objective lens 84, turning mirror 83, turning mirror 82 and is deflected by turning mirror 87 through a spherical focal lens 88 to a photodetector 89. The photodetector 89 is coupled with the computer system, and its output indicates edge detection. The edge of the wafer is detected based on the significant difference of light contrast between the wafer surface 85 and the wafer tape 86 or other low reflectivity materials on which the wafer is mounted. The computer system stops the motion of the stage upon receipt of the edge detection signal, preventing laser pulses from being directed off the side of the stage.

Figure 5:
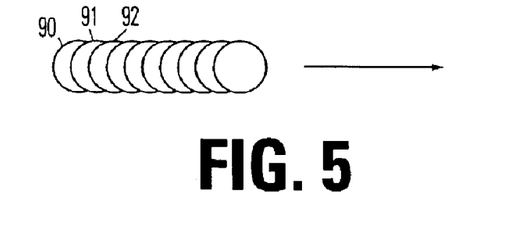
FIG. 5 illustrates the overlapping of successive pulses during the cutting of a scribe line.

FIG. 5 illustrates the overlapping of laser spots according to the present invention. At high repetition rates, as the stage moves the wafer, pulses emitted by the laser system overlap. Thus, a first pulse 90 is overlapped by a second pulse 91 which in turn is overlapped by second pulse 92 and so on. The amount of overlap determines in part the depth of the scribe lines. For a repetition rate about 10 kHz and stage speeds are between 2.5 mm/sec and 5.0 mm/sec, the overlap can easily be controlled in a range of about 50 to 99 percent. The overlap can be obtained by the following example calculation:

Laser spot size~10 micron, diameter

Stage speed~2.5 mm/sec

Then there is a (10 micron/(2.5 mm/sec)=$4.0 \times 10^{-3}$ sec overlap on a single spot 10 microns in diameter. The number of pulses that overlap the spot (shot density) is then (10000 pulses per sec)×($4 \times 10^{-3}$ sec)=40. A shot density of 40 is equal to an overlap of 97.25%.

Figure 6:
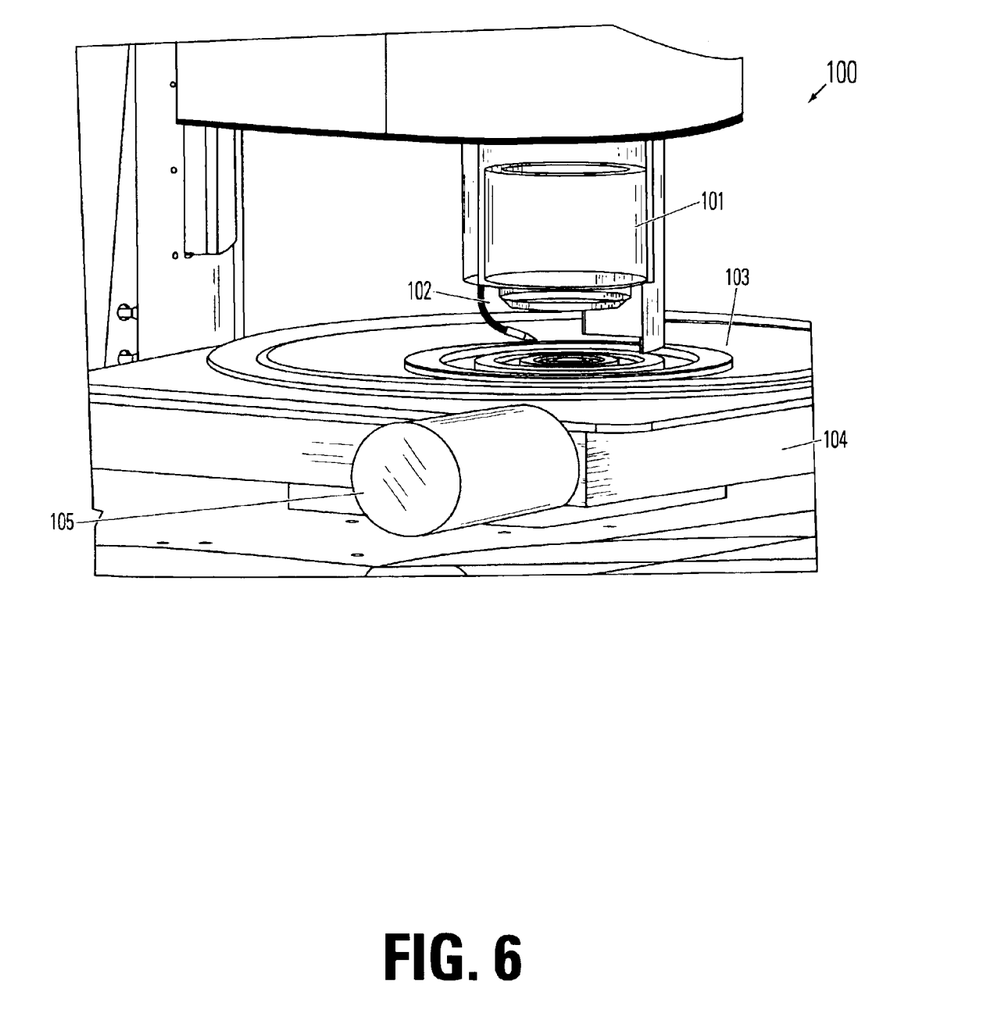
FIG. 6 is a perspective view of the stage and debris exhaust system of the sapphire scribing system according to the present invention.

FIG. 6 provides a perspective of the stage 100, objective lens 101 and debris removal jet 102 in one embodiment of the invention. The stage 100 includes a vacuum chuck 103 centered on a movable plate 104. A movable plate 104 includes manual adjustment knob 105 for the Y-direction and a similar adjustment knob (not shown) for the X-direction. Also, the movement of the stage is automatically controllable. The jet 102 is arranged to deliver air or nitrogen gas into the region of the ablation in order to remove debris. A vacuum (not shown) withdraws the gas with the debris from the region of the wafer.

In a representative system, the repetition rate is controllable within a range of 20 to 50 kHz, with a stage speed ranging up to 8 to 10 mm per second. Other combinations of repetition rate and stage speed will be developed according to the needs of a particular implementation.

Figure 7:
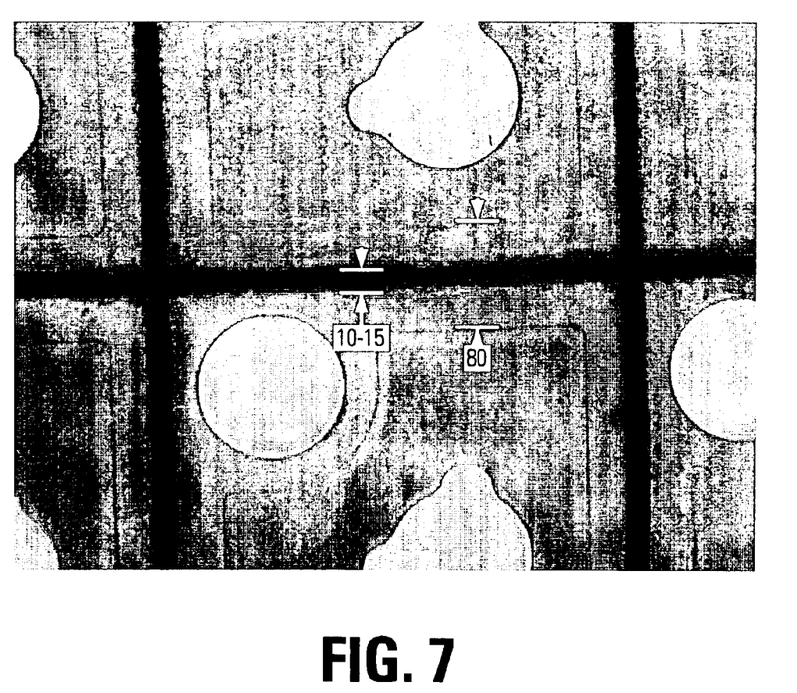
FIG. 7 illustrates a scribe pattern on a sapphire substrate including an array of integrated laser diodes for cutting into die according to the present invention.

FIG. 7 shows a magnified view of an active surface of a sapphire substrate having an array of laser diodes formed thereon. Spaces, or streets, about 80 microns wide are left between the individual laser diodes to allow room for scribing. However, the white dots should not be cut so the effective street width is less. In FIG. 7, grooves (dark lines within the streets) are machined having a width of 10–15 microns, on the top surface for perspective of the relative widths. In a preferred system, the backside of the wafer is scribed. In a typical system according to the prior art, the streets must be wide enough to accommodate diamond tipped blades. In these prior art systems, such streets have been between at least 40 wide. With the system of the present invention with a spot size in the range of 10 microns, and the precision available, the streets can be reduced to 20 or 30 microns in width or less. This significantly increases the density of devices that can be made on a single substrate and improves throughput in manufacturing process for the die.

As described above, a representative system is based on a Nd:YVO$_4$ or Nd:YAG laser medium operated at its third harmonic wavelength of 355 nanometers. Theoretically there is very little absorption at this wavelength in a sapphire crystal. However, under a very high intensity flux of laser light, greater than a GigaWatt per cm squared, for example, it is believed that non-linear absorption occurs causing the coupling of the laser energy into the sapphire material. This coupling with sufficient energy density causes ablation of sapphire. In addition, the laser pulses are highly overlapped during processing as described. The advantages of overlapping the laser pulses during micro-machining include not only improving the smoothness of the machined groove, but also enhancing the laser coupling efficiency into the sapphire material.

Figure 8A:
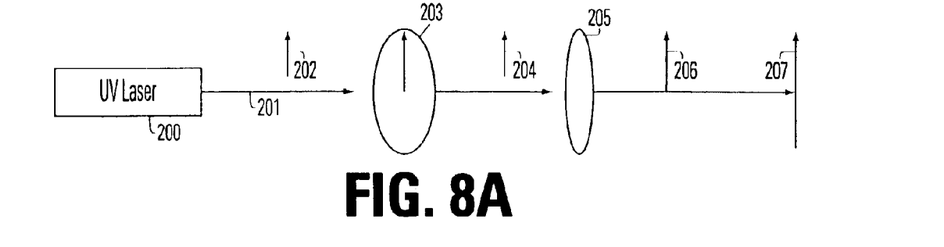
FIGS. 8A–8C show a relationship between polarization of laser pulses and scribe line scribing direction for uniform V-shaped grooves.
Figure 8B:
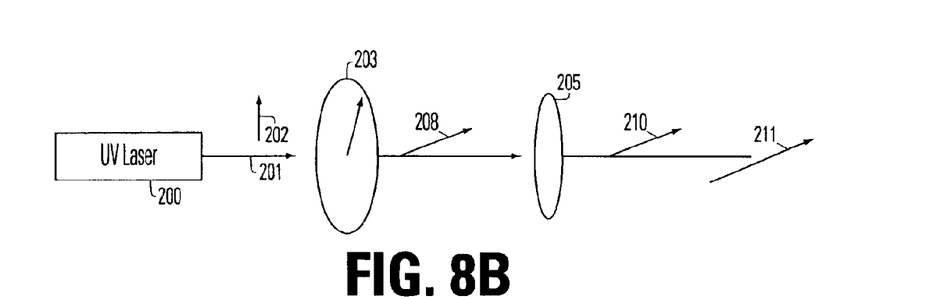
Figure 8C:
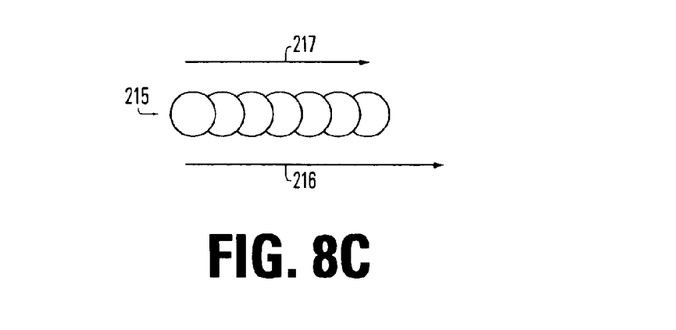

FIGS. 8A–8C illustrate control of linear polarization of the laser pulses with respect to the scribing direction on the sapphire substrate. The half wave plate 69 described above with respect to FIG. 3 is used to control polarization of the pulses in order to optimize the coupling of laser energy to the sapphire, and the uniformity of the grooves in the X- and Y-directions.

FIGS. 8A–8C illustrate control of linear polarization of the laser pulses with respect to the scribing direction on the sapphire substrate. The half wave plate 68 described above with respect to FIG. 3 is used to control polarization of the pulses in order to optimize the coupling of laser energy to the sapphire, and the uniformity of the grooves in the X- and Y-directions.

FIG. 8B illustrates the layout of FIG. 8A, with like components having the same reference numbers. In FIG. 8B, half wave plate 203 is rotated 45 degrees relative to the position of FIG. 8A. The rotation of the half wave plate 203 causes the polarization of the pulses to rotate 90 degrees as indicated by arrow 208, extending for this example into the paper. The pulses proceed through focus lens 205 maintaining their polarization as indicated by arrow 210. The polarization 210 is aligned with the machining direction of a scribe line 211 parallel with a X-axis.

FIG. 8C illustrates laser polarization direction relative to the cutting or machining direction of the scribe line. Thus, a scribe line 215 consists of the sequence of overlapping pulses aligned in a cutting direction 216. The laser polarization direction 217 in the preferred system is parallel with the cutting direction 216. The alignment of polarization parallel with the cutting direction is found to produce uniform V-shaped grooves. The V-shaped grooves allow for more uniform separation of the die than can be achieved with grooves that are more U-shaped, or that are less uniform.

Two important requirements for the sapphire scribing system are the throughput and the cutting depth of the wafer. The cutting depth of sapphire is dependent on the overlap and the energy density. It is required, typically, to cut at least half way through the wafer. In one available Nd:YAG laser embodiment, a 10 kHz repetition rate and maximum energy density 40 j/cm2 are achieved, and used for scribing according to the present invention. FIGS. 9–16 are photographs of experimental results of the scribing process using this Nd:YAG embodiment, showing the depth and V-shape of the grooves that can be achieved in representative systems. The figures show cross-sections of sample sapphire wafers having thicknesses of about 80 microns, with laser cut grooves more than half the thickness of the wafer. In these examples, an energy density is controlled in a range of about 22.5 to 40.0 j/cm2, and a stage speed in a range of about 2.5 to 5.0 mm/sec.

Figure 9:
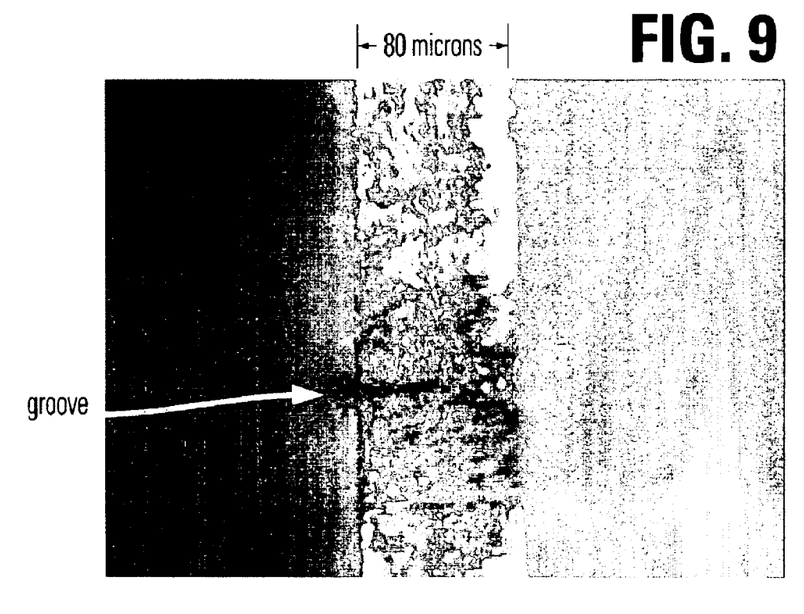
FIGS. 9–16 are photographs showing experimental results of the scribing process of the present invention.

The energy density and stage speed for FIGS. 8 to 15 are as follows:

FIG. 9: 22.5 j/cm$^2$/2.5 mm/sec

Figure 10:
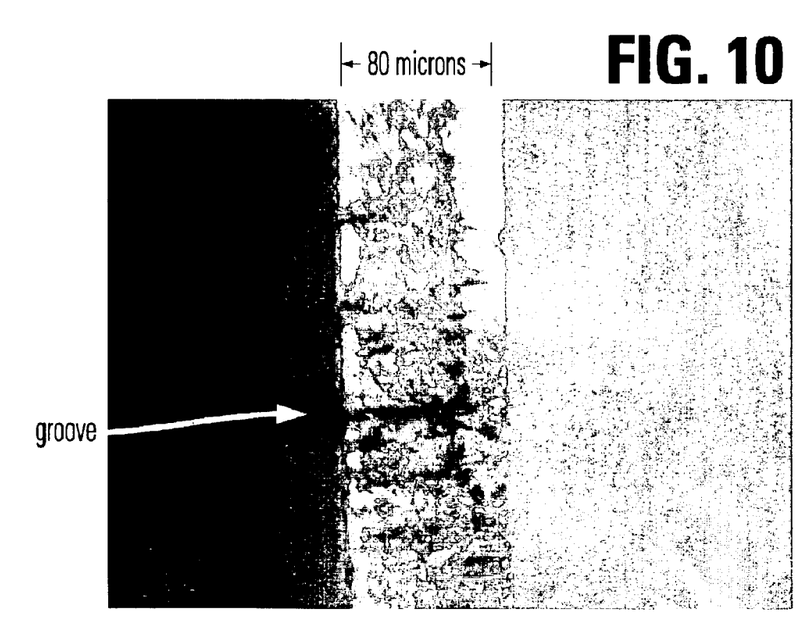

FIG. 10: 30.0 j/cm$^2$/2.5 mm/sec

Figure 11:
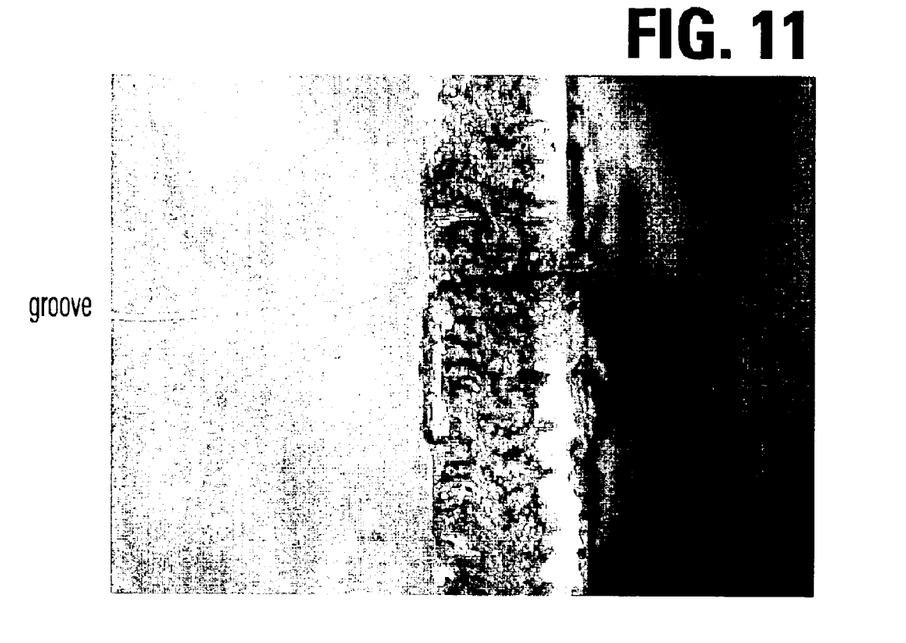

FIG. 11: 40.0 j/cm$^2$/2.5 mm/sec

Figure 12:
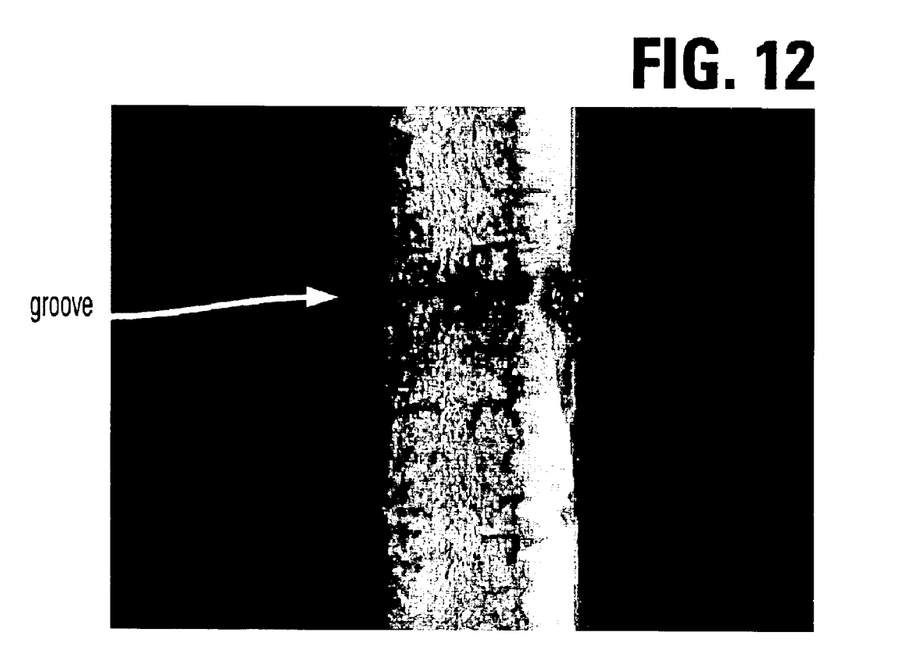

FIG. 12: 40.0 j/cm$^2$/3.0 mm/sec

Figure 13:
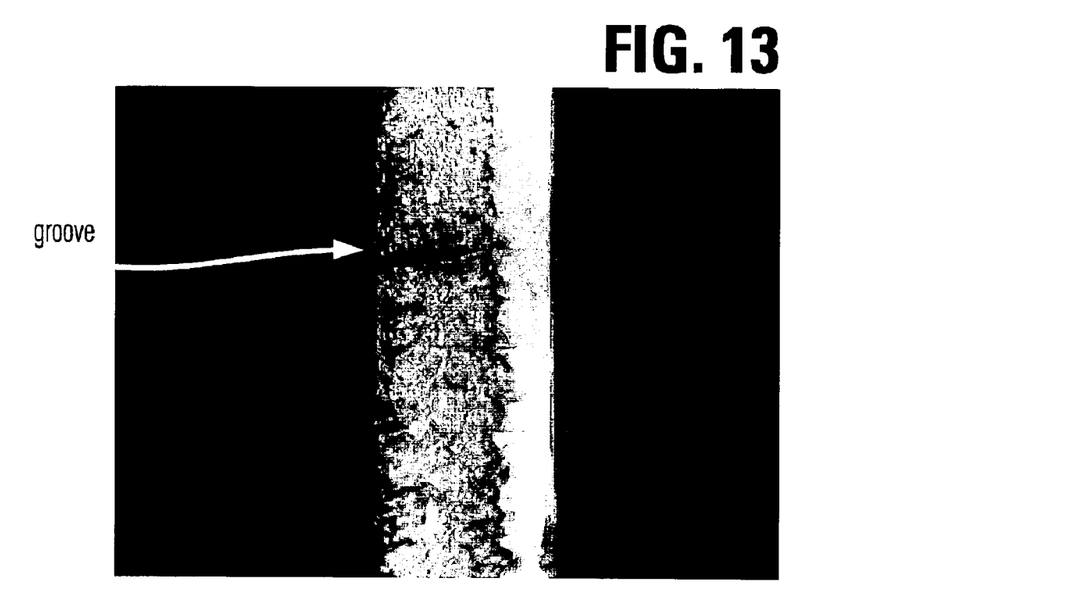

FIG. 13: 40.0 j/cm$^2$/3.5 mm/sec

Figure 14:
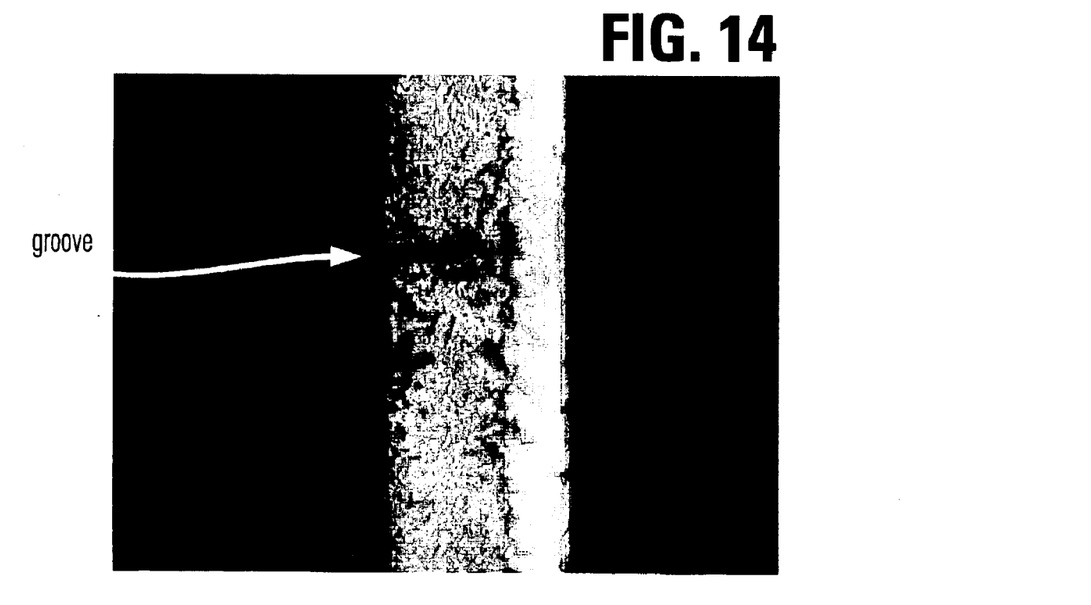

FIG. 14: 40.0 j/cm$^2$/4.0 mm/sec

Figure 15:
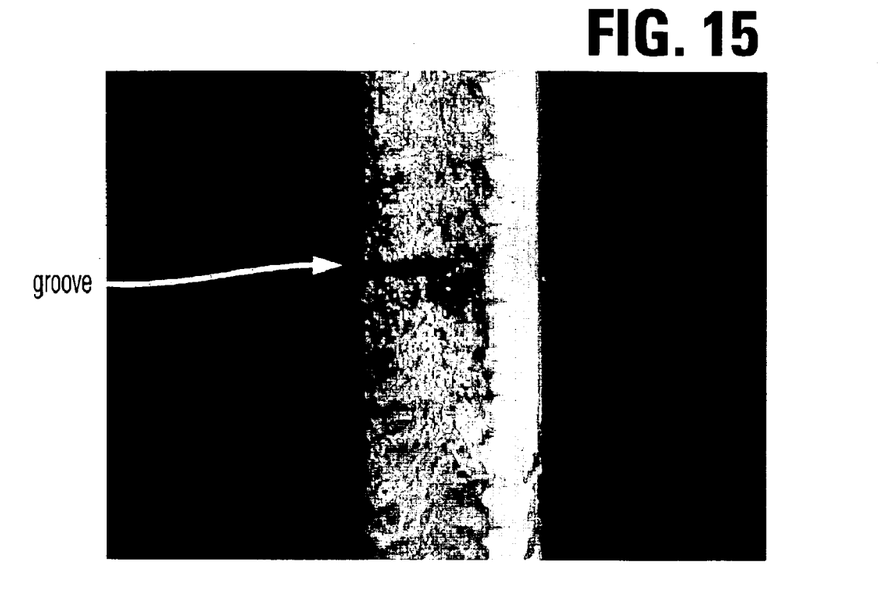

FIG. 15: 40.0 j/cm$^2$/4.5 mm/sec

Figure 16:
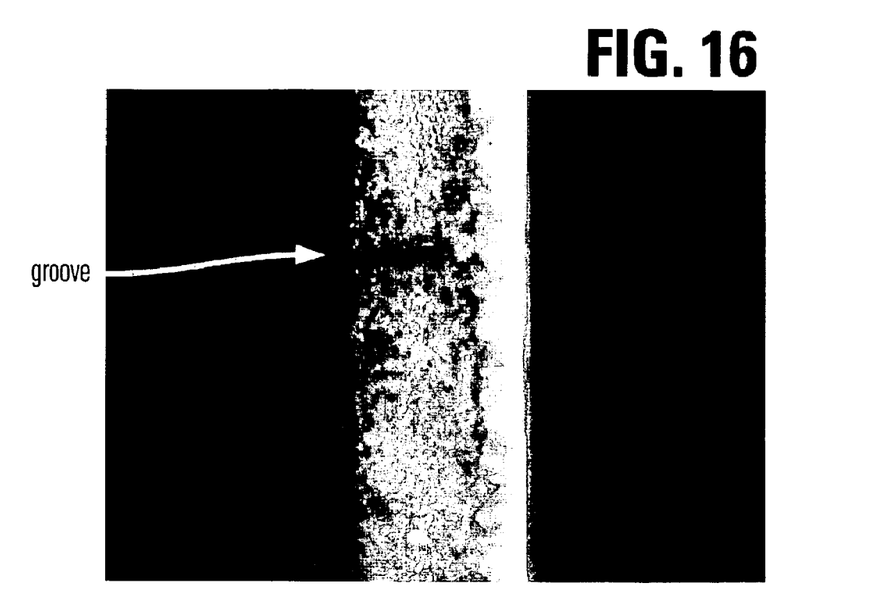

FIG. 16: 40.0 j/cm$^2$/5.0 mm/sec

It can be seen from the FIGS. 9 to 16 that the cutting depth is larger than half wafer thickness for the stage speed between 2.5 mm/sec and 5 mm/sec. A sapphire scribing system using a Nd:YVO$_4$ medium operates readily at 20 to 50 kHz, and a maximum energy density can be 45~50 j/cm2. To keep the same cutting depth and increase the throughput, the stage speed can be increased to 8~10 mm/sec, for this system.

In one embodiment, computer software is provided to engineers and operators for managing scribing operations as a step in manufacturing of laser diode die. The software operates at two levels in this example, designated an engineering interface and an operator interface. At the engineering interface level, the engineer has the ability to control the following:

Fire the laser
Change the rep rate
Change power (from 0 to 100%)
Adjust the coax light
Continuous, burst or single shot firing
Create reference point (two point for XY, and three points for XYZ)
Ability to re-coordinate: Save, recreate and move a map on a different wafer to coincide with previously determined reference points.
Create wafer map: which controls the following
    Manipulate wafer map by changing horizontal and vertical spacing
    Size of the wafer scribe pattern
    Explode scribe pattern to individual lines: Take a wafer and make it into several individual lines
    Translate or rotate patterns
    Laser setting: which controls the following:
        Speed of the stage
        Rep rate
        Polarization
        Laser power (0–100%)
        Number of passes
        Depth of passes
Explode lines: which controls the following
    Move each line individually
    Change all setting individually
    Translate or rotate lines individually
    Ability to save and recall
    Stop and begin at the beginning of any line
Ability to turn ON and OFF the vacuum and nitrogen air
Calibrate the edge detection With the operator interface, the user will control the following:
    Vacuum control (Load the wafer mechanism)
    Place a new map from the tools library
    Ability to rotate the map
    Run the system
    Abort if needed The present invention provides a process for manufacturing laser diode die, and other integrated device die, formed on sapphire substrates. Procedures according to embodiments of the invention include the following:

1) laying out and forming laser diodes in an array on an active surface of a sapphire substrate, with individual laser diodes separated by streets having a width less than 40 microns, and preferably around 25 microns or less;
2) placing the sapphire wafer with the active surface facing down on wafer tape on a metal frame;
2) placing the taped wafer with a metal frame on the vacuum chuck of the wafer stage, and turning on the vacuum to secure the wafer and tape to the stage;
3) moving the wafer to a home position by controlling the stage
4) automatically, or semi-automatically, aligning the wafer position to coordinates established by the computer setup;
5) setting up a scribe pattern based on wafer and die size and layout parameters;
6) automatically, or semi-automatically, setting up the lighting levels for edge detection;
7) setting up stage speed, laser polarization and laser power for the required cutting depth;
8) turning on the debris removing system;
9) starting the process of laser scribing based on the scribing pattern on one line parallel to one axis;
10) continuing the process on other lines and axes, while controlling polarization, until the wafer is finished;
11) causing the stage to return to an exit position, turn off the vacuum, and removing the wafer from the chuck;
12) cleaning wafer with high-speed air or other gas jet to remove laser machining induced debris;
13) applying mechanical pressure to break the wafer along the scribe lines; and
14) stretch the wafer tape for separation and transport using a pick and place system to other mounting apparatus.

The procedures outlined above are carried out using the systems described above, or similar systems.

Accordingly, the present invention provides a significantly improved scribing process and system for use with sapphire substrates. The process and system are low-cost, high yield, and high throughput compared to prior art sapphire scribing technologies.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for manufacturing die from a sapphire substrate, comprising:
producing a laser beam having a wavelength below about 560 nanometers;
coupling the laser beam into a sapphire substrate by absorption sufficient to induce ablation of the sapphire substrate;
moving the laser beam relative to the sapphire substrate in a first direction to create via the ablation a first scribe line in the substrate that extends in the first direction;
moving the laser beam relative to the sapphire substrate in a second direction different from the first direction to create via the ablation a second scribe line in the substrate that extends in the second direction;
linearly polarizing the laser beam in a direction parallel to the first direction as the first scribe line is created; and
linearly polarizing the laser beam in a direction parallel to the second direction as the second scribe line is created.

2. The method of claim 1, wherein the moving of the laser beam relative to the sapphire substrate in the first and second directions includes mounting the sapphire substrate on a stage and moving the stage relative to the laser beam.

3. The method of claim 1, wherein the first direction is generally orthogonal to the second direction.

4. The method of claim 1, wherein the sapphire substrate has a thickness, and the first and second scribe lines are created with a depth of more than about half of said thickness.

5. A method for manufacturing die from a sapphire substrate, comprising;

mounting the sapphire substrate on a stage, the sapphire substrate having a surface;

producing pulsed laser energy having a wavelength below about 560 nanometers using a Q-switched Nd:YVO$_4$ laser;

coupling a sequence of pulses of the pulsed laser energy directly into the surface of the sapphire substrate by absorption sufficient to induce ablation of sapphire at the surface;

causing the sequence of pulses to impact the sapphire substrate in a scribe pattern comprising a plurality of intersecting scribe lines, so that the ablation cuts the plurality of intersecting scribe lines which extend in at least first and second directions in the sapphire substrate, and so that pulses in the sequence of pulses overlap spatially with previous and following pulses; and linearly polarizing the laser energy in a direction parallel to the first direction while cutting the scribe lines extending in the first direction, and changing the polarization to a direction parallel to the second direction while cutting the scribe lines extending in the second direction.

6. The method of claim 5, wherein the sapphire substrate has a thickness, and the scribe lines are cut to a depth of about one half, or more, of said thickness.

* * * * *